United States Patent
Kim et al.

(10) Patent No.: US 9,780,228 B2
(45) Date of Patent: Oct. 3, 2017

(54) OXIDE SEMICONDUCTOR DEVICE AND METHOD FOR MANUFACTURING SAME

(71) Applicant: Industry-Academic Cooperation Foundation, Yonsei University, Seoul (KR)

(72) Inventors: Hyun Jae Kim, Seoul (KR); Yeong-gyu Kim, Gyeongsangnam-do (KR); Ji Hoon Park, Gyeonggi-do (KR); Seokhyun Yoon, Seoul (KR); Seonghwan Hong, Incheon (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 14/954,669

(22) Filed: Nov. 30, 2015

(65) Prior Publication Data

US 2016/0163867 A1    Jun. 9, 2016

(30) Foreign Application Priority Data

Nov. 28, 2014    (KR) .................. 10-2014-0168445

(51) Int. Cl.
*H01L 29/78* (2006.01)
*H01L 29/66* (2006.01)
(Continued)

(52) U.S. Cl.
CPC .... *H01L 29/7869* (2013.01); *H01L 21/02554* (2013.01); *H01L 21/02565* (2013.01);
(Continued)

(58) Field of Classification Search
CPC ................. H01L 29/7869; H01L 21/02; H01L 21/02554; H01L 21/02565;
(Continued)

(56) References Cited

U.S. PATENT DOCUMENTS

| 8,940,647 B2 * | 1/2015 | Liu ....................... H01L 21/425 257/E21.085 |
| 2010/0038641 A1 * | 2/2010 | Imai .................. H01L 29/78696 257/57 |

(Continued)

FOREIGN PATENT DOCUMENTS

| JP | 2008-042088 A | 2/2008 |
| JP | 2010-153842 A | 7/2010 |

(Continued)

OTHER PUBLICATIONS

Park, J.H., et al., Simple Method to Enhance Positive Bias Stress Stability of In—Ga—Zn—O Thin-Film Transistors Using a Vertically Graded Oxygen-Vacancy Active Layer, ACS Appl. Mater. Interfaces, Nov. 17, 2014, 1 pg.

(Continued)

*Primary Examiner* — Fazli Erdem
(74) *Attorney, Agent, or Firm* — Procopio, Cory, Hargreaves & Savitch LLP

(57) ABSTRACT

Provided are an oxide semiconductor device and a method for manufacturing same, wherein the oxide semiconductor device according to an embodiment of the inventive concept includes a substrate, and an oxide semiconductor layer on the substrate having different concentration of oxygen vacancy in the thickness direction.

6 Claims, 11 Drawing Sheets

(51) Int. Cl.
  *H01L 29/786* (2006.01)
  *H01L 29/24* (2006.01)
  *H01L 21/02* (2006.01)

(52) U.S. Cl.
  CPC ........ *H01L 21/02631* (2013.01); *H01L 29/24* (2013.01); *H01L 29/66969* (2013.01); *H01L 29/78696* (2013.01)

(58) Field of Classification Search
  CPC ... H01L 21/02631; H01L 29/24; H01L 29/66; H01L 29/78; H01L 29/66969; H01L 29/78696
  See application file for complete search history.

(56) References Cited

U.S. PATENT DOCUMENTS

| | | | |
|---|---|---|---|
| 2010/0038791 A1* | 2/2010 | Lee | H01L 45/08 257/758 |
| 2010/0276682 A1* | 11/2010 | Yeh | H01L 29/78609 257/43 |
| 2011/0057185 A1* | 3/2011 | Peng | H01L 29/4908 257/43 |
| 2012/0025187 A1* | 2/2012 | Park | H01L 29/7869 257/43 |
| 2013/0126862 A1* | 5/2013 | Yamazaki | H01L 21/383 257/43 |
| 2013/0153891 A1* | 6/2013 | Zan | H01L 29/78 257/43 |
| 2014/0034945 A1* | 2/2014 | Tokunaga | H01L 29/24 257/43 |
| 2014/0183529 A1* | 7/2014 | Yamazaki | H01L 29/7869 257/43 |
| 2014/0239293 A1* | 8/2014 | Yamazaki | H01L 29/78 257/43 |
| 2014/0306219 A1* | 10/2014 | Yamazaki | H01L 27/1225 257/43 |
| 2015/0044851 A1* | 2/2015 | Lee | H01L 45/08 438/382 |
| 2015/0048299 A1* | 2/2015 | Hwang | H01L 29/8615 257/4 |
| 2016/0049517 A1* | 2/2016 | Lee | H01L 29/78696 257/43 |
| 2016/0079089 A1* | 3/2016 | Koezuka | H01L 21/477 438/104 |

FOREIGN PATENT DOCUMENTS

| | | |
|---|---|---|
| JP | 2013-048219 A | 3/2013 |
| KR | 10-2010-0027377 A | 3/2010 |
| KR | 10-2013-0093922 A | 8/2013 |
| KR | 2013-0094195 A | 8/2013 |
| KR | 10-2014-0029000 A | 3/2014 |
| WO | 2011132529 A | 10/2011 |

OTHER PUBLICATIONS

Son, H., et al., Improvements in the Device Characteristics of IZO-based Transparent Thin-Film Transistors with Co-Sputtered HfO2—Al2O3 Gate Dielectrics, Current Applied Physics, 11, 2011, pp. S135-S138.

* cited by examiner

FIG. 8

| | Mobility(cm²/Vs) | Threshold voltage (v) | Flashing rate | Subthreshold voltage swing (v/decade) |
|---|---|---|---|---|
| Comparative embodiment 1 | 10.77 | 1.31 | $6.34 \times 10^8$ | 0.36 |
| Embodiment 1 | 9.21 | 1.13 | $2.06 \times 10^8$ | 0.45 |
| Embodiment 2 | 8.04 | 4.63 | $1.61 \times 10^8$ | 0.57 |
| Embodiment 3 | 6.52 | 7.21 | $7.24 \times 10^7$ | 0.66 |
| Comparative embodiment 2 | 1.14 | 0.43 | $1.70 \times 10^6$ | 0.65 |

OXIDE SEMICONDUCTOR DEVICE AND METHOD FOR MANUFACTURING SAME

CROSS-REFERENCE TO RELATED APPLICATIONS

This U.S. non-provisional patent application claims priority under 35 U.S.C. §119 of Korean Patent Application No. 10-2014-0168445, filed on Nov. 28, 2014, the entire contents of which are hereby incorporated by reference.

STATEMENT REGARDING PRIOR DISCLOSURES BY THE INVENTORS

The inventors of the present application authored and disclosed the subject matter of the present application on Nov. 17, 2014 (published online). This prior disclosure has been submitted in an Information Disclosure Statement in the present application as "PARK, J. H., et al., Simple Method to Enhance Positive Bias Stress Stability of In—Ga—Zn—O Thin-Film Transistors Using a Vertically Graded Oxygen-Vacancy Active Layer, ACS Appl. Mater. Interfaces, Nov. 17, 2014."

BACKGROUND

The present disclosure herein relates to an oxide semiconductor device, and a method for manufacturing same.

Oxide semiconductor devices to substitute for a-Si-based semiconductor devices have been recently studied. The oxide semiconductor device, which includes a thin-film made of a metal oxide, has been noted as a switching device of a display panel due to better electrical and optical characteristics relative to the a-Si-based semiconductor device.

For typical semiconductor devices, oxide semiconductor devices having high reliability and electrical characteristic are manufactured by modifying shapes of oxide semiconductor layers or by using an oxide semiconductor layer including thin-films made of different metal elements. However, manufacturing process thereof is complicate.

SUMMARY

The present disclosure provides a method for manufacturing an oxide semiconductor device having high reliability and electrical characteristic with a simple process.

An embodiment of the inventive concept provides an oxide semiconductor device including a substrate; and an oxide semiconductor layer on the substrate, wherein the oxide semiconductor layer may have different concentrations of oxygen vacancy in the thickness direction.

In an embodiment, the oxide semiconductor layer may include a plurality of oxide thin-films having different concentrations of oxygen vacancy.

In an embodiment, the plurality of oxide thin-films may include a first oxide thin-film on the substrate; and a second oxide thin-film on the first oxide thin-film, wherein the concentration of oxygen vacancy of the first oxide thin-film may be higher than concentration of oxygen vacancy of the second oxide thin-film, and the thickness of the first oxide thin-film may be greater than the thickness of the second oxide thin-film.

In an embodiment, the first oxide thin-film and the second oxide thin-film may be made of the same metal element.

In an embodiment, the thickness ratio of the first oxide thin-film and the second oxide thin-film may be 3:1 to 1:3.

In an embodiment, the oxide semiconductor layer comprises at least one selected from InGaZnO, ZnO, ZrInZnO, InZnO, AlInZnO, ZnO, InGaZnO$_4$, ZnInO, ZnSnO, In$_2$O$_3$, Ga$_2$O$_3$, HfInZnO, GaInZnO, HfO$_2$, SnO$_2$, WO$_3$, TiO$_2$, Ta$_2$O$_5$, In$_2$O$_3$SnO$_2$, MgZnO, ZnSnO$_3$, ZnSnO$_4$, CdZnO, CuAlO$_2$, CuGaO$_2$, Nb2O$_5$ or TiSrO$_3$.

In an embodiment, in any one of claims 1 to 6, a gate electrode and a gate insulation layer disposed between the substrate and the oxide semiconductor layer; and a source electrode and a drain electrode on the oxide semiconductor layer may be further included.

In an embodiment, the oxide semiconductor layer may have higher concentration of oxygen vacancy when closer to the gate electrode.

In an embodiment of the inventive concept, a method for manufacturing an oxide semiconductor device with a vacuum process may include: preparing a substrate in a vacuum chamber; and forming an oxide semiconductor layer on the substrate, wherein the forming an oxide semiconductor layer may include varying oxygen partial pressure in the chamber.

In an embodiment, during the varying of oxygen partial pressure on the chamber, the oxygen partial pressure in the chamber may vary within a range from about 0% to about 20%.

In an embodiment, the forming an oxide semiconductor layer may include forming a plurality of oxide thin-films by varying oxygen partial pressure in the chamber.

In an embodiment, the forming a plurality of oxide thin-films may include: forming a first oxide thin-film on the substrate by adjusting oxygen partial pressure in the chamber to about 0%; and forming a second oxide thin-film on the first oxide thin-film by adjusting oxygen partial pressure in the chamber to about 5%.

In an embodiment, the forming a plurality of oxide thin-films may include forming oxide thin-films including the first oxide thin-film and the second oxide thin-film having different thickness.

In an embodiment, the thickness ratio of the first oxide thin-film and the second oxide thin-film may be 3:1 to 1:3.

In an embodiment, further included are forming a gate electrode and a gate insulation layer on the substrate prior to the forming the oxide semiconductor layer; and forming a source electrode and a drain electrode on the oxide semiconductor layer after the forming the oxide semiconductor layer.

In an embodiment, the forming the oxide semiconductor layer may include increasing oxygen partial pressure in the chamber

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 8 shows electrical characteristics of the oxide thin-film transistors, which are manufactured according to embodiments 1 to 3 and comparative embodiments 1 and 2 of the inventive concept;

DETAILED DESCRIPTION

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Although not defined, all terminology used herein (including technical or scientific terminology) has same meaning as generally recognized by a person skilled in the art on the basis of general description in the typical technique. It will be construed that terminology defined by general dictionary has same meaning as that indicated in related technique and/or the disclosure of the application, and expression that is not specifically defined herein should not be generalized or excessively formally interpreted. The terminology used herein is not for delimiting the present invention but for describing the embodiments.

Herein, the singular form includes plural forms unless otherwise specified. As used herein, the term "comprising" and/or various conjugational forms such as "inclusion", and "comprising" "including" do not exclude presence or addition of one or more of other compositions, ingredients, components, steps, operations and/or elements to the indicated composition, ingredient, component, step, operation and/or element. Also, wording "provide", "have" should be construed in the same manner. Further, it will also be understood that when a layer is referred to as being 'on' another layer, it can be directly on the other layer, or intervening layers may also be present.

The present disclosure herein relates to an oxide semiconductor device having high reliability and electrical characteristic and a method for manufacturing same.

According to an embodiment of the inventive concept, by adjusting concentration of oxygen vacancy of an oxide semiconductor layer having the same metal element through a simple process of varying oxygen partial pressure during formation of the oxide semiconductor layer of the oxide semiconductor device, the oxide semiconductor device having high performance may be manufactured. Further, according to another embodiment of the inventive concept, the oxide semiconductor device having high performance may be manufactured by adjusting thickness ratio of two or more oxide thin-films which are deposited by varying oxygen partial pressure during formation of the oxide semiconductor layer.

Hereinafter, exemplary embodiments of the inventive concept will be described in detail with reference to the accompanying drawings.

Figure 1:
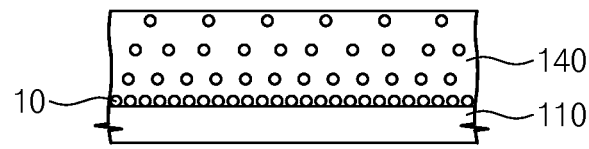
FIG. 1 is an illustration to show an oxide semiconductor layer of an oxide semiconductor device 100 according to an embodiment of the inventive concept.

FIG. 1 is an illustration to show an oxide semiconductor layer of an oxide semiconductor device 100 according to an embodiment of the inventive concept.

As shown in FIG. 1, the oxide semiconductor device 100 includes a substrate 110; and an oxide semiconductor layer 140 on the substrate, wherein the oxide semiconductor layer 140 may have different concentration of oxygen vacancy 10 in the thickness direction of the oxide semiconductor layer. In one embodiment, the oxide semiconductor layer 140 may include at least any one of InGaZnO, ZnO, ZrInZnO, InZnO, AlInZnO, ZnO, InGaZnO$_4$, ZnInO, ZnSnO, In$_2$O$_3$, Ga$_2$O$_3$, HfInZnO, GaInZnO, HfO$_2$, SnO$_2$, WO$_3$, TiO$_2$, Ta$_2$O$_5$, In$_2$O$_3$SnO$_2$, MgZnO, ZnSnO$_3$, ZnSnO$_4$, CdZnO, CuAlO$_2$, CuGaO$_2$, Nb$_2$O$_5$ or TiSrO$_3$.

The oxide semiconductor layer 140 according to an embodiment of the inventive concept will be described with reference to FIGS. 2 and 3.

Figure 2:
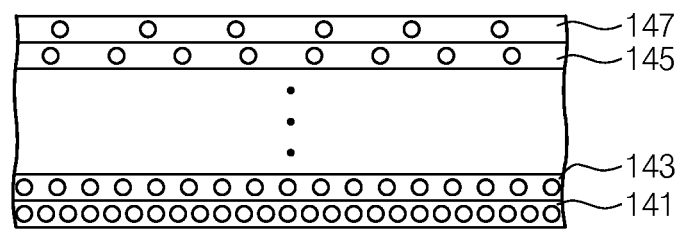
FIG. 2 is an illustration to show an oxide semiconductor layer 140 according to an embodiment of the inventive concept.

FIG. 2 is an illustration to show the oxide semiconductor layer 140 according to an embodiment of the inventive concept.

As shown in FIG. 2, the oxide semiconductor layer 140 according to an embodiment of the inventive concept may include a plurality of oxide thin-films 141, 143, 145, 147 having different concentration of oxygen vacancy 10. In an embodiment, concentration of oxygen vacancy 10 of the plurality of oxide thin-films 141, 143, 145, 147 may be sequentially increased or decreased.

Figure 3:
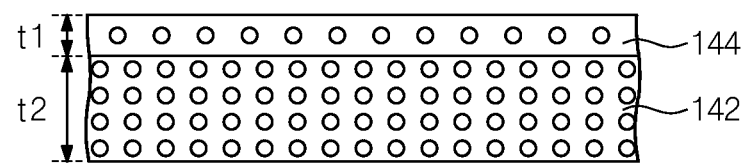
FIG. 3 is an illustration to show an oxide semiconductor layer 140 according to another embodiment of the inventive concept.

FIG. 3 is an illustration to show an oxide semiconductor layer 140 according to another embodiment of the inventive concept.

As shown in FIG. 3, the oxide semiconductor layer 140 according to an embodiment of the inventive concept may include a first oxide thin-film 142 and a second oxide thin-film 144 having different concentration of oxygen vacancy 10. In an embodiment, concentration of oxygen vacancy of the first oxide thin-film 142 may be higher than concentration of oxygen vacancy of the second oxide thin-film 144, and the thickness of the first oxide thin-film t1 may be greater than the thickness of the second oxide thin-film t2. Further, all metal elements constituting the first oxide thin-film 142 and the second oxide thin-film 144 may be same, and only concentration of oxygen vacancy 10 may be different. In an embodiment, the thickness ratio of the first oxide thin-film 142 and the second oxide thin-film 144 may be 3:1 to 1:3.

Figure 4:
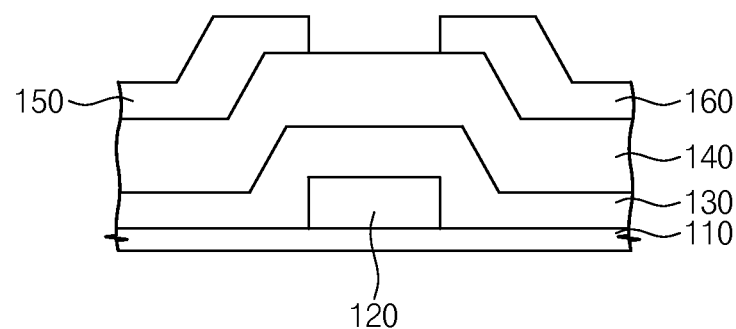
FIG. 4 is an exemplary cross sectional view of an oxide thin-film transistor, which is an embodiment of an oxide semiconductor device according to an embodiment of the inventive concept.

FIG. 4 is an exemplary cross sectional view of an oxide thin-film transistor as an embodiment of an oxide semiconductor device according to an embodiment of the inventive concept.

As shown in FIG. 4, as an embodiment of an oxide semiconductor device according to an embodiment of the inventive concept, the oxide thin-film transistor may include a substrate 110; a gate electrode 120 on the substrate; a gate insulation layer 130 on the gate electrode 120; an oxide semiconductor layer 140 on the gate insulation layer 130; and a source electrode 150 and a drain electrode 160 on the oxide semiconductor layer 140. In other word, the gate electrode 120 and the gate insulation layer 130 may be disposed between the substrate 110 and the oxide semiconductor layer 140, and the oxide semiconductor layer 140 may include the source electrode 150 and drain electrode 160 thereon. In an embodiment, as the oxide semiconductor layer 140 is close to the gate electrode, concentration of oxygen vacancy of the oxide semiconductor layer 140 may tend to increase. Therefore, the oxide thin-film transistor having high reliability may be manufactured while maintaining high mobility in lower part of the oxide semiconductor layer having high concentration of oxygen vacancy, which plays a role in supplying electrons.

Figure 5:
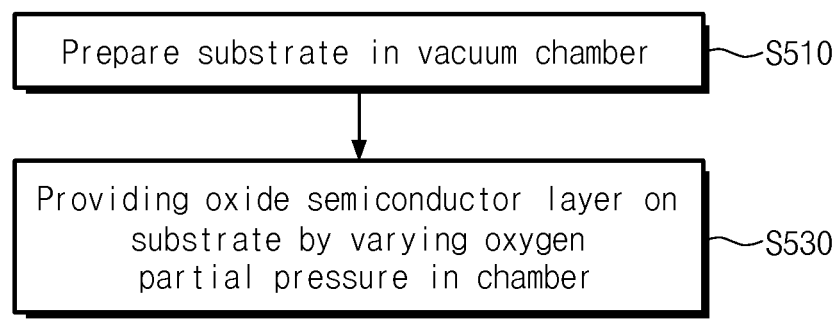
FIG. 5 is a flow chart to show a process of manufacturing the oxide semiconductor device according to an embodiment of the inventive concept.

FIG. 5 is a flow chart to show a process of manufacturing an oxide semiconductor device according to an embodiment of the inventive concept.

As shown in FIG. 5, the method for manufacturing an oxide semiconductor device may include: (S510) preparing a substrate in a vacuum chamber, and (S530) forming an oxide semiconductor layer on the substrate while varying oxygen partial pressure in the chamber. The oxygen partial pressure indicates a ratio of pressure of oxygen ($O_2$) to the total gas in the vacuum chamber.

In an embodiment, in the forming the oxide semiconductor layer (S530), oxygen partial pressure in the chamber may vary in the range from about 0% to about 20%.

In another embodiment, the forming the oxide semiconductor layer (S530) may include forming a plurality of oxide thin-films by varying oxygen partial pressure in the chamber. In an embodiment, the forming the plurality of oxide thin-films may include forming a first oxide thin-film on the substrate by adjusting oxygen partial pressure in the chamber to about 0%, and forming a second oxide thin-film on the first oxide thin-film by adjusting oxygen partial pressure in the chamber to about 5%.

Moreover, in the forming the oxide semiconductor layer (S540), the first oxide thin-film and the second oxide thin-film may be formed such that the thickness of the first and second oxide thin-films are different from each other. In an embodiment, the thickness of the first oxide thin-film may be greater than the thickness of the second oxide thin-film. As an example, it has been experimentally demonstrated that the first oxide thin-film and the second oxide thin-film having the thickness ratio of about 3:1 to about 1:3 may be formed, and the highest reliability and electrical characteristic are obtained in the case where the thickness ratio is 3:1.

Figure 6:
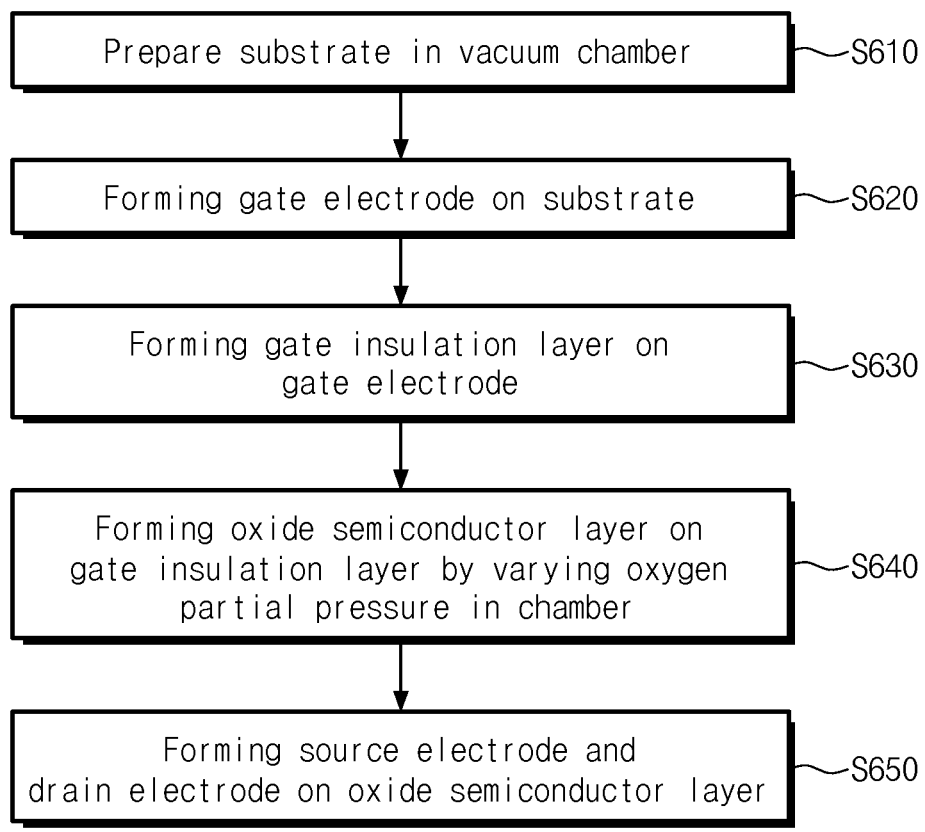
FIG. 6 is a flow chart to show a process of manufacturing the oxide thin-film transistor as an embodiment of the oxide semiconductor device according to an embodiment of the inventive concept.

FIG. 6 is a flow chart to show a process of manufacturing an oxide thin-film transistor as an embodiment of an oxide semiconductor device according to an embodiment of the inventive concept.

As shown in FIG. 6, the process of manufacturing the oxide thin-film transistor as an embodiment of the oxide semiconductor device according to an embodiment of the inventive concept may include: (S610) preparing a substrate in a vacuum chamber; (S620) forming a gate electrode on the substrate; (S630) forming a gate insulation layer on the gate electrode; (S640) forming an oxide semiconductor layer on the gate insulation layer while varying oxygen partial pressure in the chamber; and (S650) forming a source electrode and drain electrode on the oxide semiconductor layer. In an embodiment, in the forming the oxide semiconductor layer on the gate insulation layer while varying oxygen partial pressure in the chamber (S640), the oxide semiconductor layer may be formed by gradually increasing oxygen partial pressure in the chamber.

Hereinafter, disclosure of the inventive concept will be described in more detail with reference to embodiments 1 to 3 and comparative embodiments 1 and 2 of the inventive concept, and also characteristic of a semiconductor device according to an embodiment of the inventive concept is identified through experimental results shown in FIGS. 7 to 11.

Embodiments 1 to 3 InGaZnO TFT

At first, a substrate was prepared by doping a Si substrate with P+ and then allowing $SiO_2$ to thermally grow thereon. To remove organic materials and impurities, which may be formed on the surface, ultrasonic cleaning was performed in an order of acetone, methanol, and DI-water (for 10 minutes for each), and thereafter blurring was performed by using $N_2$ gas. Then, the prepared substrate was placed into a sputter chamber, and high vacuum was formed to reach $1 \times 10^{-6}$ Torr. Thereafter, Ar was injected to form plasma, and an InGaZnO thin-film, which is an oxide semiconductor layer, was manufactured by the sputtering method by gradationally adjusting oxygen partial pressure. A target used in manufacture of the InGaZnO thin-film was 3 inch target having the molar ratio of $In_2O_3$—$Ga_2O_3$—ZnO of 1:1:1. In addition, during the deposition process of the InGaZnO thin-film, power was set to about 150 W; process pressure in the whole chamber was set to about 5 mTorr; and the total deposition time was set to about 5 minutes. Additionally, the ratio of time of depositing the InGaZnO thin-film by using Ar alone and time of depositing the InGaZnO thin-film by using $O_2$ and Ar (such that the ratio of $O_2$ to Ar was about 5%) was adjusted to 75:25, 50:50, and 25:75 to form the thin-film. Consequently, manufactured were samples having thickness ratio of the InGaZnO thin-film (a first InGaZnO thin-film) and the InGaZnO thin-films (a second InGaZnO thin-film) of 75:25 (embodiment 1), 50:50 (embodiment 2), and 25:75 (embodiment 3), wherein the InGaZnO thin-film (the first InGaZnO thin-film) was manufactured by adjusting oxygen partial pressure in the chamber to about 0% during manufacture of the InGaZnO thin-film and the InGaZnO thin-films (the second InGaZnO thin-film) was manufactured by adjusting oxygen partial pressure to about 5%. After the InGaZnO thin-film formation, all samples were subjected to heat-treatment at about 300□ for about one hour, and thereafter about 200 nm of aluminum (Al) was deposited with an evaporator method for source and drain electrodes.

Comparative Embodiments 1 and 2

Except that, for comparative embodiment 1, an InGaZnO thin-film was manufactured by adjusting oxygen partial pressure in a chamber to about 0%, and for comparative embodiment 2, an InGaZnO thin-film was manufactured by adjusting oxygen partial pressure in the chamber to about 5%, other processes are same as that of embodiments 1 to 3. In other word, each of InGaZnO thin-film was manufactured as a single thin-film.

Figure 7:
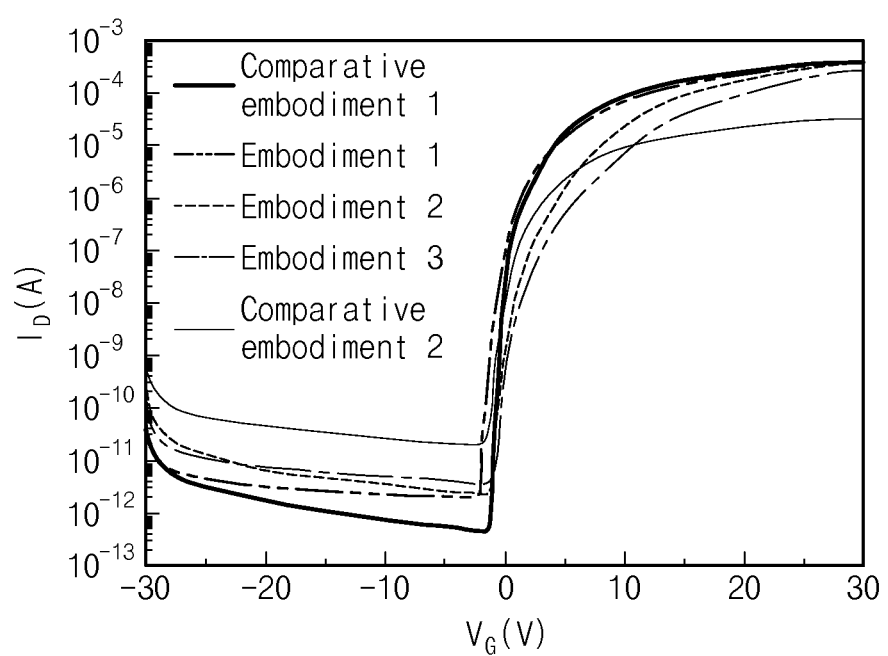
FIG. 7 is a graph showing transfer characteristics of the oxide thin-film transistors which are manufactured according to embodiments 1 to 3 and comparative embodiments 1 and 2 of the inventive concept.

FIG. 7 is a graph showing transfer characteristics of the oxide thin-film transistors which are manufactured according to embodiments 1 to 3 and comparative embodiments 1 and 2 of the inventive concept.

As shown in FIG. 7, although transfer characteristics of the oxide thin-film transistors manufactured according to embodiments 1 to 3 and comparative embodiments 1 and 2 are not significantly different, it can be found that transfer characteristic in embodiment 1 is particularly excellent.

FIG. 8 is a graph showing electrical characteristics of the oxide thin-film transistors which are manufactured according to embodiments 1 to 3 and comparative embodiments 1 and 2 of the inventive concept.

Referring to FIG. 8, it is possible to know mobility, threshold voltage, flashing rate and subthreshold swing (S.S) of the oxide thin-film transistors according to embodiments 1 to 3 and comparative embodiment 1 and 2 of the inventive concept. It can be found that mobility in embodiments 1 to 3 and comparative embodiment 1 of the inventive concept is high, but mobility in comparative embodiment 2 is significantly decreased.

Figure 9:
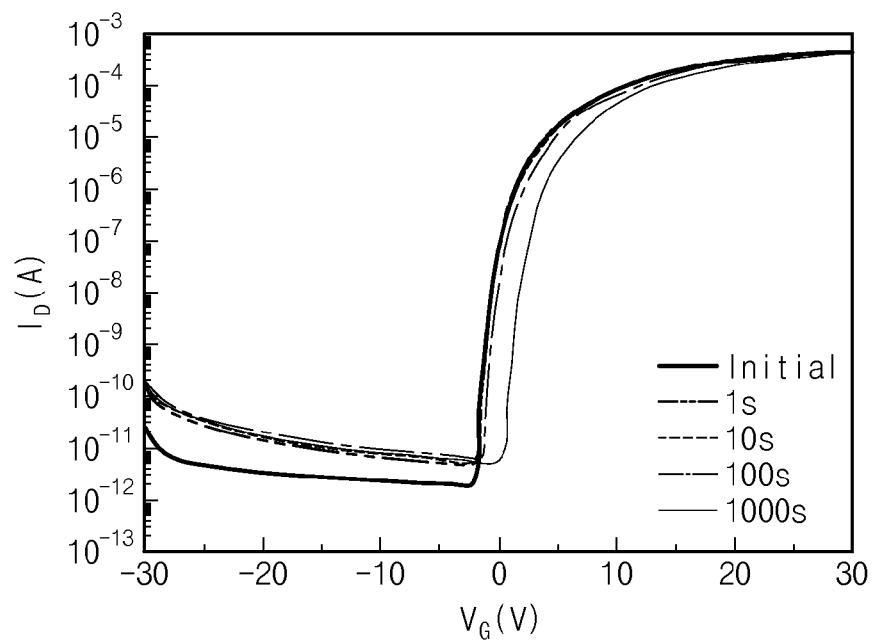
FIGS. 9 and 10 are graphs showing results of positive bias stress (PBS) test of the oxide thin-film transistors respectively manufactured according to embodiment 1 and comparative embodiment 1 of the inventive concept.
Figure 10:
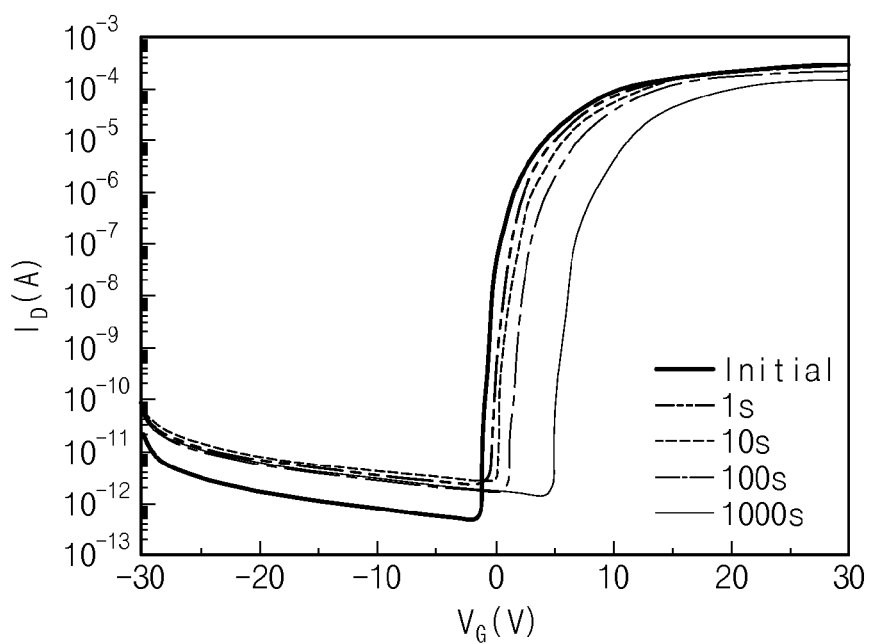

FIGS. 9 and 10 are graphs respectively showing results of positive bias stress (PBS) test of the oxide thin-film transistors manufactured according to embodiment 1 and comparative embodiment 1 of the inventive concept.

An experiment was performed to investigate reliability of the oxide thin-film transistors according to embodiments 1 and comparative embodiment 1 of the inventive concept under stress circumstance. An applied voltage for a gate-source electrode was about 20 V and an applied voltage for a drain-source electrode was about 10.1 V. Then, transfer characteristic was measured after about 1, 10, 100, and 1000 seconds of stress application.

With referring to FIGS. 9 and 10, it can be found that variation in threshold voltage in embodiment 1 (see FIG. 9), according to the inventive concept, is lower than that of comparative embodiment 1 (see FIG. 10), indicating better reliability.

Figure 11:
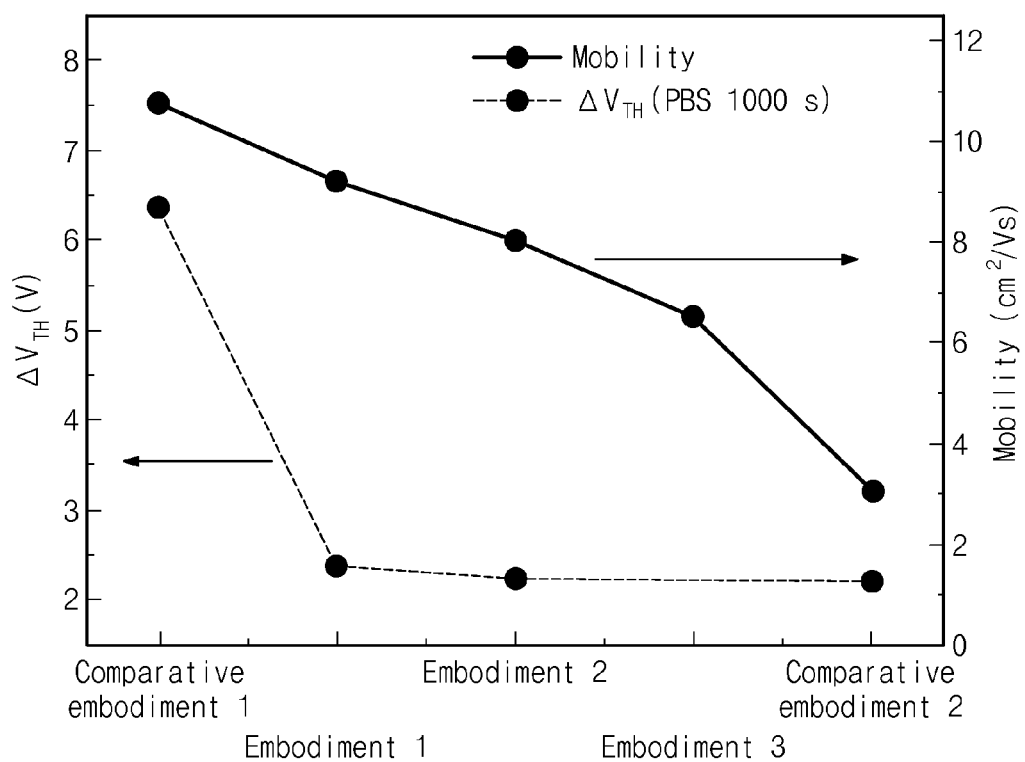
FIG. 11 is a graph showing variation of threshold voltage ($\Delta V_{TH}$) and mobility of the oxide thin-film transistors after 1000 seconds of PBS, wherein the transistors are manufactured according to embodiments 1 to 3 and comparative embodiments 1 and 2 of the inventive concept.

FIG. 11 is a graph showing variation of threshold voltage ($\Delta V_{TH}$) and mobility of the oxide thin-film transistors after about 1000 seconds of PBS, wherein the transistors are manufactured according to embodiments 1 to 3 and comparative embodiments 1 and 2 of the inventive concept.

With referring to FIG. 11, it can be found that, as the thickness of the thin-film having oxygen partial pressure to Ar of about 5% gets thicker, mobility is reduced and variation of threshold voltage ($\Delta V_{TH}$) is decreased so that reliability is enhanced. In addition, it can be found that reliability is greatly enhanced while maintaining high mobility in the case where the thickness ratio of thin-films having oxygen partial pressure to Ar of about 0% and 5% is 3:1. i.e., embodiment 1.

Then, with referring to FIGS. 12A, 12B, 13A, 13B, 14A, 14b, and 15, concentrations of oxygen vacancy of the oxide semiconductor layers of the oxide thin-film transistors according to embodiment 1 and comparative embodiments 1 and 2 of the inventive concept are investigated through XPS measurement results.

FIGS. 12A, 12B, 13A, 13B, 14A and 14B show peaks associated with oxygen peak strength (O1s) among measurement results obtained by XPS depth analysis. When deconvolution was performed with low-mid-high binding energy, a low energy peak indicates M-O-M, a mid energy peak indicates oxygen vacancy, and a high energy peak indicates M-OH binding. Concentration of oxygen vacancy may be obtained through an area occupied by a mid energy peak among total O1s peak area.

Figure 12A:
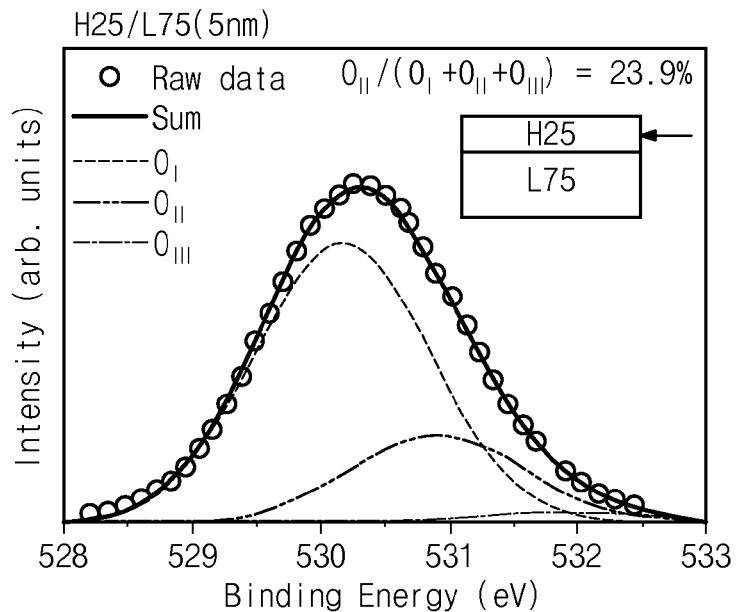
FIGS. 12A and 12B are graphs showing results obtained through XPS depth analysis measured at about 5 nm and about 20 nm depths of the oxide semiconductor layer (about 40 nm) of the oxide thin-film transistor which is manufactured according to embodiment 1 of the inventive concept.
Figure 12B:
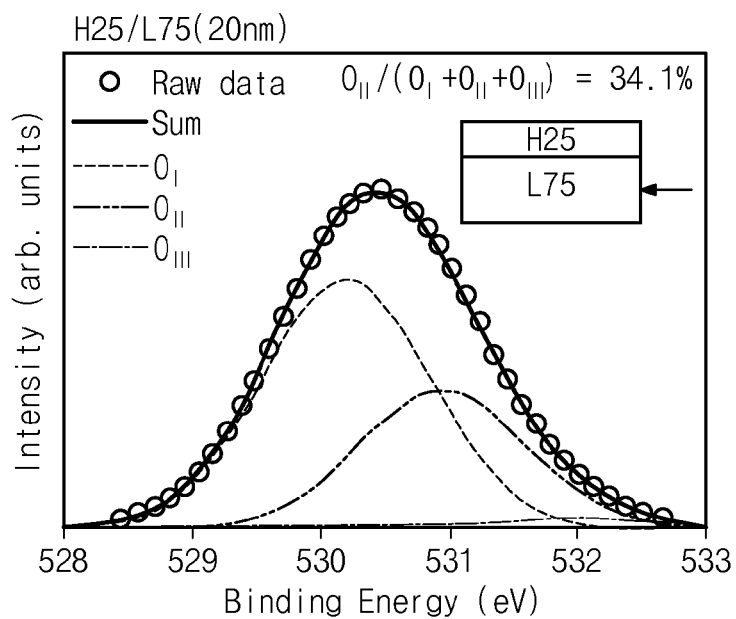

FIGS. 12A and 12B are graphs showing results obtained through XPS depth analysis measured at about 5 nm and about 20 nm depths in the oxide semiconductor layer (about 40 nm) of the oxide thin-film transistor which is manufactured according to embodiment 1 of the inventive concept.

With referring to FIGS. 12A and 12B, concentration of oxygen vacancy at about 5 nm depth, which was the second oxide thin-film H25 portion, was about 29.5%, and concentration of oxygen vacancy at about 20 nm depth which was the first oxide thin-film L75 portion, was about 34.1%, wherein the second oxide thin-film H25 portion was deposited by adjusting oxygen partial pressure in the chamber to about 5% and the first oxide thin-film L75 portion was deposed by adjusting oxygen partial pressure in the chamber to about 0%. In other word, it can be found that concentrations of oxygen vacancy are different when oxide thin-films are formed by using different oxygen partial pressure.

FIGS. 13A, 13B, 14A and 14Bb are graphs showing results obtained through XPS depth analysis measured at about 5 nm and about 20 nm depths in the oxide semiconductor layers (about 40 nm) of oxide thin-film transistors which are respectively manufactured according to comparative embodiments 1 and 2.

Figure 13A:
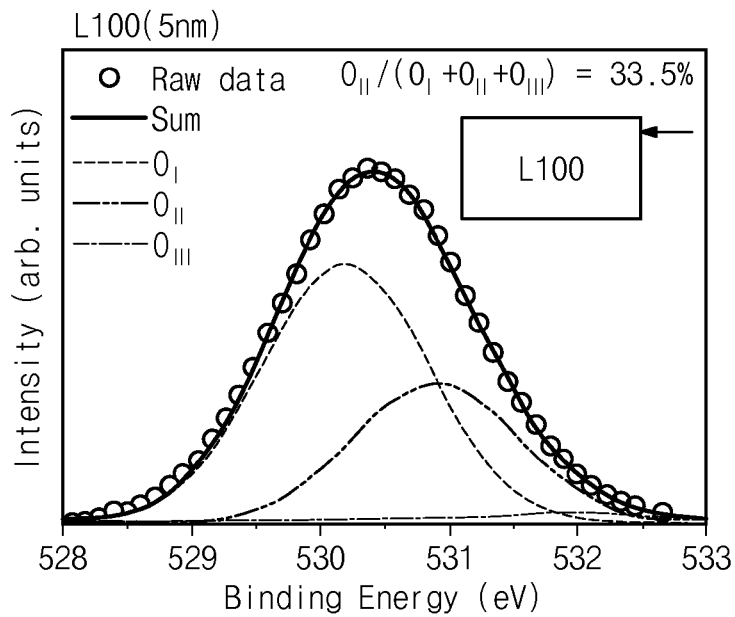
FIGS. 13A and 13B, and 14A and 14B are graphs showing results obtained through XPS depth analysis measured at about 5 nm and about 20 nm depths of the oxide semiconductor layers (about 40 nm) of the oxide thin-film transistors which are respectively manufactured according to comparative embodiments 1 and 2.
Figure 13B:
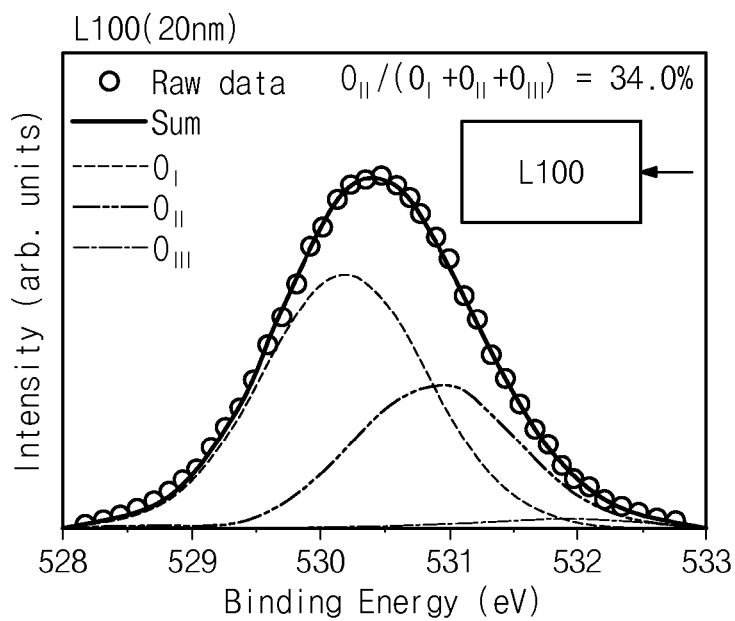

With referring to FIGS. 13A and 13B, it can be found that concentration of oxygen vacancy at about 5 nm is about 33.5%, and concentration of oxygen vacancy at about 20 nm is about 34.0% so that concentrations of oxygen vacancy depending on depth are not significantly different compared to that of embodiment 1.

Figure 14A:
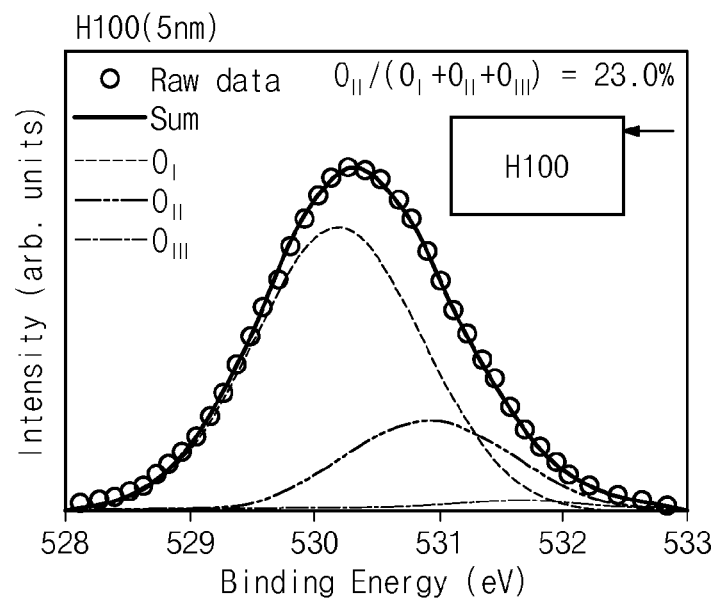
Figure 14B:
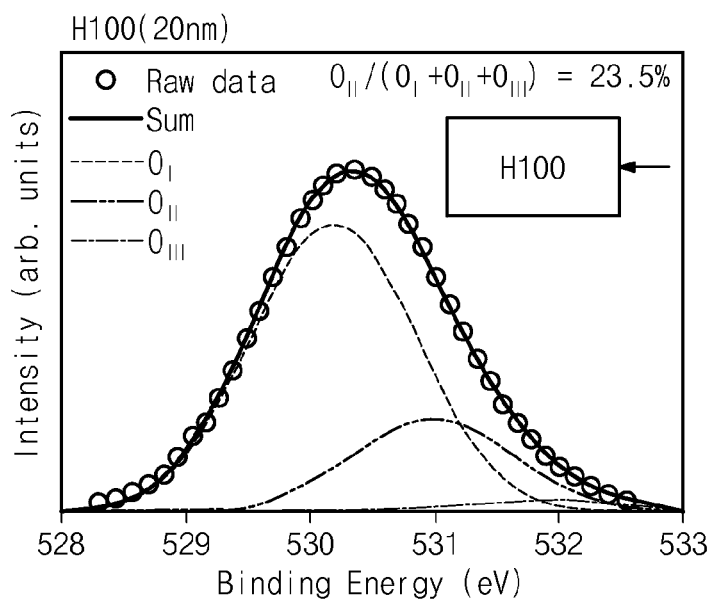

In addition, as well as FIGS. 13A and 13B, for FIGS. 14A and 14B, concentration of oxygen vacancy at about 5 nm is about 23.0%, and concentration of oxygen vacancy at about 20 nm is about 23.5%, so that there is no significant difference compared to embodiment 1.

Figure 15:
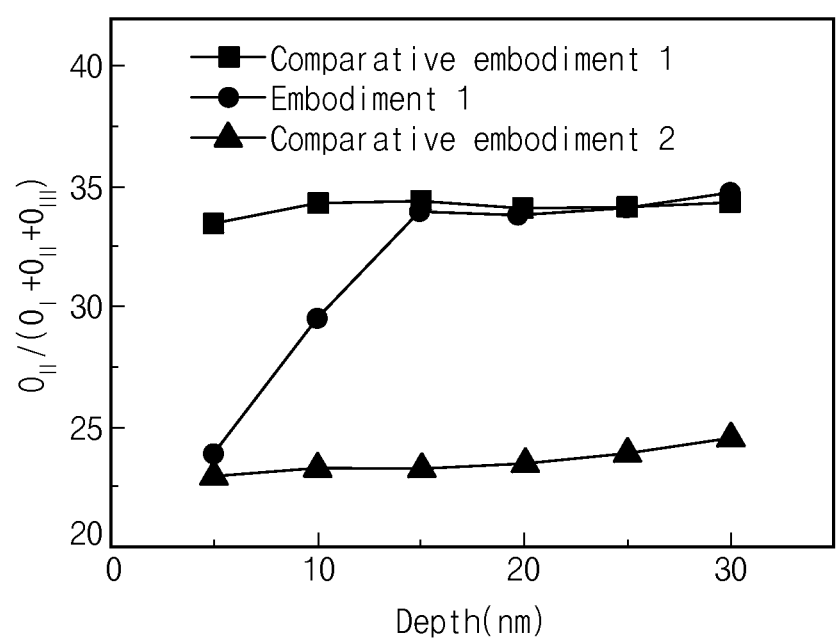
FIG. 15 is a graph showing changes in concentration of oxygen vacancy depending on depths of the oxide semiconductor layers of respective oxide thin-film transistors which are manufactured according to embodiments and comparative embodiments 1 and 2 of the inventive concept.

FIG. 15 is a graph showing changes in concentration of oxygen vacancy depending on depths of oxide semiconductor layers of respective oxide thin-film transistors which are manufactured according to embodiments and comparative embodiments 1 and 2 of the inventive concept.

With referring to FIG. 15, it can be found that, only for embodiment 1, changes in concentration of oxygen vacancy are significant, and for comparative embodiments 1 and 2, changes in concentration of oxygen vacancy are small.

According to embodiments of the inventive concept, the oxide semiconductor device having high reliability and electrical characteristic may be manufactured with a simple process.

Effects of the inventive concept are not limited to the effect described above, and effects that are not mentioned will be apparent to a person skilled in the art, to which the present invention belongs, from the specification and appended drawings.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An oxide semiconductor device, comprising:
a substrate; and
an oxide semiconductor layer on the substrate, wherein the oxide semiconductor layer has different concentrations of oxygen vacancy in the thickness direction,
wherein the oxide semiconductor layer comprises:
a first oxide thin-film on the substrate; and
a second oxide thin-film on the first oxide thin-film,
wherein a concentration of oxygen vacancy of the first oxide thin-film is higher than a concentration of oxygen vacancy of the second oxide thin-film, and a thickness of the first oxide thin-film is greater than a thickness of the second oxide thin-film.

2. The oxide semiconductor device of claim 1, wherein the first oxide thin-film and the second oxide thin-film have the same metal element.

3. The oxide semiconductor device of claim 1, wherein a thickness ratio of the first oxide thin-film and the second oxide thin-film is 3:1.

4. The oxide semiconductor device of claim 1, wherein the oxide semiconductor layer comprises at least one selected from InGaZnO, ZnO, ZrInZnO, InZnO, AlInZnO, ZnO, InGaZnO$_4$, ZnInO, ZnSnO, In$_2$O$_3$, Ga$_2$O$_3$, HfInZnO, GaInZnO, HfO$_2$, SnO$_2$, WO$_3$, TiO$_2$, Ta$_2$O$_5$, In$_2$O$_3$SnO$_2$, MgZnO, ZnSnO$_3$, ZnSnO$_4$, CdZnO, CuAlO$_2$, CuGaO$_2$, Nb2O$_5$ and TiSrO$_3$.

5. The oxide semiconductor device of claim 1, further comprising:
a gate electrode and a gate insulation layer disposed between the substrate and the oxide semiconductor layer; and
a source electrode and a drain electrode on the oxide semiconductor layer.

6. The oxide semiconductor device of claim 5, wherein the oxide semiconductor layer has higher concentration of oxygen vacancy when closer to the gate electrode.

* * * * *